Dec. 22, 1970 A. STEPPBERGER ET AL 3,549,437

METHOD OF PRODUCING METAL STRUCTURES ON SEMICONDUCTOR SURFACES

Filed Feb. 10, 1967

United States Patent Office 3,549,437
Patented Dec. 22, 1970

3,549,437

METHOD OF PRODUCING METAL STRUCTURES ON SEMICONDUCTOR SURFACES

Alfred Steppberger and Herbert Goetzeler, Munich, Germany, assignors to Siemens Aktiengesellschaft, a corporation of Germany Filed Feb. 10, 1967, Ser. No. 615,211
Claims priority, application Germany, Feb. 11, 1966, S 101,956
Int. Cl. H01l *7/50;* C23f *1/02*
U.S. Cl. 156—4 4 Claims

ABSTRACT OF THE DISCLOSURE

Process of decreasing etching time during production of fine metal structures. An additional metal, e.g. Au or Ag, having a variable redox potential is added during vapor precipitation of metal layer, e.g. aluminum, at pressure $<10^{-5}$ torr.

One of the last method steps in the production of electrical structural components, particularly semiconductor microcomponents by the planar or the mesa techniques is the defined application of aluminum emitters, base contacts or base transit paths. This is so effected that a semiconductor disc on which a plurality of structural element systems are produced and which is subsequently divided into individual systems is coated with the desired metal, e.g. aluminum by vapor deposition using appropriate masks or patterns. In systems of semiconductor structural components having closed and very small geometries, the method of coating by masks is not applicable, as the rim areas of the regions deposited on the semiconductor crystal surface are incompletely formed due to the shading effect of the masks.

These difficulties are first eliminated by an overall vapor deposition of aluminum on the crystal surface and subsequently, after coating with an appropriate photo varnish and a reproduction of the desired structures by exposing and developing the photovarnish, stripping off the aluminum at those localities of the semiconductor system which are not coated with the respective masking and which perform no function in the future circuits.

Since the photovarnish must again be removed following the etching of the metal, the preferred varnishes are those which are easily soluble in organic solutions, as for example acetone. Since the commercially available photovarnishes soluble in acetone are passably stable only up to a pH of 12, it is generally customary to use a dilute alkali carbonate solution for removing the aluminum. Despite the slight alkalinity, each etching treatment with a dilute alkali carbonate solution results in an increased expansion of the photovarnish and thereby reduces its adhesiveness. This results in particularly pronounced underetching. When aluminum layers which are vapor-deposited onto a "cold" surface are used, the underetching is more or less tolerable. On the other hand, hot vapor-depositing which is universally preferred, due to its better adhesion to the crystal disc and the better contacting properties, leads to considerably stronger underetching. Due to the sintering which occurs during hot vapor-depositing, the deposited aluminum loosens at one-half the rate, at 350° C., of the "cold" vapor-deposited aluminum. Increasing the alkali concentration or increasing the bath temperatures to reduce the etching period is not possible because of the aforementioned sensitivity of the photovarnish.

The present invention solves the problem of shortening the etching periods during the production of very fine metal structures, particularly of those used for producing contact areas on semiconductor crystals, without impairing the sharpness of the contours and the uniformity of the etching. According to the teaching of the invention, at least one additional metal, which shows a variable redox potential relative to hydrogen, i.e. silver, is added. This is done during the precipitation of metal, e.g. aluminum, over the entire area, the additional metal being applied to the substrate surface to be processed.

It is within the framework of the invention to effect the metal precipitation on the surface to be treated, by vapor-deposition at a pressure of $<10^{-5}$ torr and preferably to use gold or sliver as the additional metal, during the production of the metal layer, particularly of aluminum. By the slight addition of metal, for example 1% silver during the vaporization of aluminum, the etching period may be reduced to one-fourth the etching period without the metal addition. The increase in the solubility of the aluminum results from the formation of the local element aluminum-silver. By reducing the etching means, expansion and removal of the photovarnish from the substrate is largely avoided, so that underetching of the edges is substantially reduced. Thus, the method upon which our invention is based, permits a very economic production of fine aluminum structures which are necessary in the production of structural components systems having geometries in the order of magnitude of a few $\mu$ width, having been produced according to planar technology.

Preferably, the layer thickness of the applied metal layer is so selected that it amounts to approximately $1\mu$, particularly $0.8\mu$. A further development of our invention is in the use of an aluminum tape coated with a galvanic layer of the additional metal, particularly gold and/or silver, as the vaporization source.

In one embodiment of our invention, the temperature of the vaporization source is at 900–1000° C., preferably at 900° C. with the vaporization period at from five to ten minutes. It is preferred to heat the surface to be processed, e.g. a monocrystalline silicon disc, during the metal precipitation, to a temperature of, e.g. 200–400° C. Compared to cold vaporization, this feature has the advantage of ensuring a better adhesion of the metal layer to the crystal disc and thus easier contacting.

The method according to the invention is particularly well suited for the production of semiconductor structural components, particularly of silicon transistors, diodes, and integrated circuits, as well as multipoled structural components, e.g. resistors and capacitors. It is also possible to use the method of our invention for the production of photolithographic metal structures.

The invention will be further described with respect to the drawing in which

Figure 3:
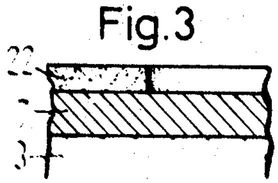
Figure 4:
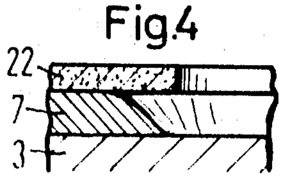
Figure 5:
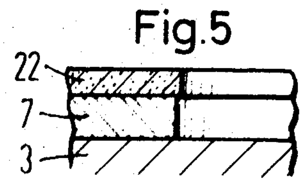

FIGS. 3 to 5 compare the results of the invention with conventional techniques.

Figure 1:
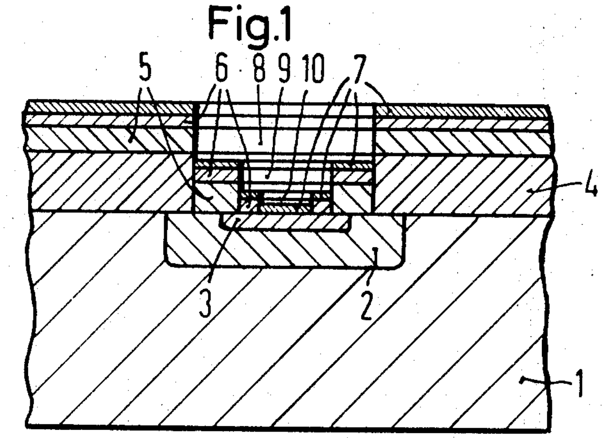
FIG. 1 shows a device produced by the invention.

FIG. 1 shows, in section, an approximately $160\mu$ thick antimony doped silicon monocrystalline disc 1, wherein a region 2 is produced by indiffusing a p-doped substance, for example boron, through window 8 etched by phototechnique, into an oxide layer upon the surface of the semiconductor crystal 1. The n-doped region 3 is produced by indiffusion of phosphorus through a window 9, etched into the oxide layer, into region 2. During the indiffusion of phosphorus, the entire silicon crystal disc is provided with a phosphorus-oxide glass layer, into which an additional window 10 is etched for inserting the metal contact, the etching being effected by means of photo technique and hydrofluoric acid buffered to pH 4–5 by ammonium fluoride, so that the portions of the oxide layers marked 4, 5 and 6, remain on the silicon disc. The regions of the semiconductor body marked 7 represent the metal layer which we precipitate over the entire area with 1% silver admixed to the vapor-deposited aluminum. Following vaporization, the crystal disc is coated with a conventional photovarnish and the desired structures are established through exposing and developing the photovarnish. Thereafter, the uncovered regions of the metal layer are eliminated and the crystal disc is further processed for producing a silicon planar transistor.

Figure 2:
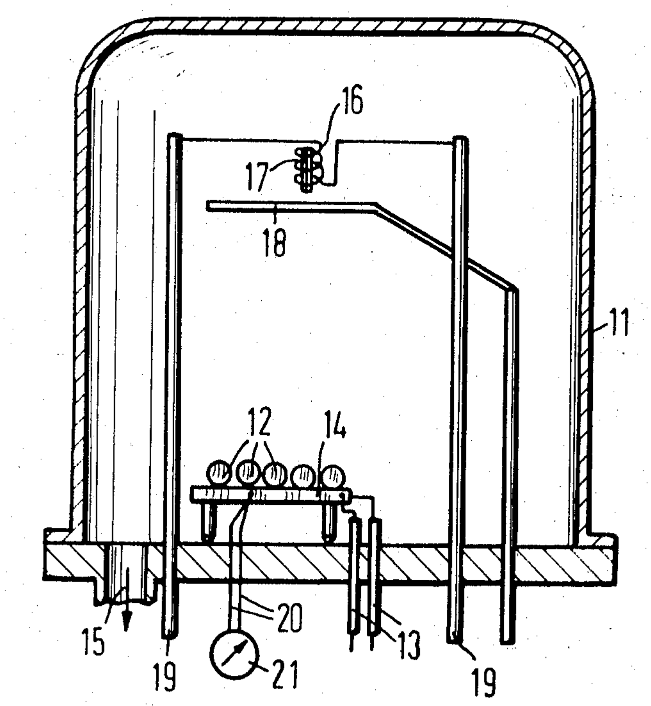
FIG. 2 shows the apparatus used in the invention.

FIG. 2 illustrates the vaporizing device used in our method. Prior to the metal vaporizing process, the silicon crystal layer, having a variety of doped regions and containing a plurality of structural component systems is freed, in a customary manner, from the photovarnish which had been applied for the window etching process (window 10 in FIG. 1). Thereafter processing takes place which lasts about five minutes and is effected with hot acetone and a thorough rinsing with deionized water, usually in an ultrasonic wash. Following drying process with hot air, approximately 16 discs are immediately inserted into a vaporizing apparatus, as shown in FIG. 2, comprising a recipient 11. The discs 12 are placed on tantalum carrier 14 which is heated by the current conductors 13. To evacuate the recipient 11, an oil diffusion or other vacuum pump is connected to the vaporizing apparatus, as indicated by arrow 15. A tungsten coil 16 is used as the vaporizer for the metals to be precipitated. An alloy 17 of the metals to be precipitated, as a band which consists, for example of aluminum, with a 1% by weight addition of silver, is inserted into the vaporizer. The tungsten coil 16, with the alloy 17, is heated above a closed diaphragm 18, by current conductors 19, to a temperature at which the alloy vaporizes continually, e.g. about 900° C. The carrier 14, where the crystal discs 12 to be coated are located, is heated to a temperature of 350° C. by current conductors 13. The temperature prevailing during the processing may be easily adjusted by varying the current in response to measurements determined by thermoelement 20 whose legs are connected, for example, with a millivoltmeter 21. When the pressure in the recipient amounts to $<10^{-5}$, the metal alloy 17 located within the tungsten coil 16 is vaporized at diaphragm 18, which is opened, and precipitated to a desired layer thickness of, e.g. $0.8\mu$, upon the crystal discs 12, located on the carrier 14. The vaporization process lasts about 5 to 8 minutes. After a cooling-off period, the crystal discs are removed from the recipient and coated with a layer of $0.5\mu$ thick of a conventional photovarnish. The layer of photovarnish is then exposed, using a suitable mask and subsequently developed. The desired geometry is maintained, thereby, as a varnish structure and serves, during the etching process, as a protective coating or an etching mask. The crystal discs are etched in an alkaline solution, for example a 3% potassium carbonate solution of about 50° C., for a period of about 8 to 10 minutes, whereby the fine metal structures, required for producing contact surfaces, are preserved at an excellent contour sharpness and uniformity, beneath the photovarnish layer. The etching process is controlled optically and stopped when the silicon-dioxide layer, located beneath the metal layer which will be etched away, is exposed.

FIGS. 3 to 5 clearly show the difference in the production of very fine metal structures, according to the method of the invention compared to the conventional methods.

FIG. 3 shows a device prior to the etching process. 3 denotes the surface to be contacted, for example an n-doped region of a silicon monocrystal, 7 the vapor-deposited metal layer, consisting either of pure aluminum or of aluminum which has been supplemented with another metal, for example 1% silver, and 22 is the photovarnish layer, exposed and developed according to the desired structure.

FIG. 4 shows a diagram of the device, disclosed in FIG. 3, without the additional metal, following the etching process. The reference numerals are the same as in FIG. 3.

FIG. 5 illustrates a drawing of the device, described in FIG. 3, following the etching process, whose metal layer marked 7, results according to the method of the invention, through the precipitation of metal over the entire area, by adding another metal. This prevents to a large extent, the underetching, seen plainly in FIG. 4, beneath the photovarnish 22, serving as an etching mask. The reference numerals are also the same as in FIG. 3.

We claim:

1. In a method for producing very fine aluminum contact surface areas on semiconductor monocrystals, which comprises precipitating a metal layer upon the surface to be processed, subsequently coating this layer with an appropriate photovarnish and reproducing the desired structure by exposure and development of a photovarnish and stripping off the regions of the metal layer which were not coated with an etching mask, the improvement which comprises precipitating the metal upon the entire surface of the monocrystals with about a 1% addition of at least another metal selected from gold, silver, nickel, iron and cobalt.

2. In a method for producing very fine aluminum contact surface areas on semiconductor monocrystals, which comprises precipitating an aluminum layer upon the surface to be processed, subsequently coating this layer with an appropriate photovarnish and reproducing the desired structure by exposure and development of a photovarnish and stripping off the regions of the aluminum layer which were not coated with an etching mask with a 3% potassium carbonate solution, the temperature of the vapor source being adjusted to 900–1000° C., and the temperature of the processed surface, during aluminum precipitation, being from 200 to 400° C., said metal precipitation is from five to ten minutes, the improvement which comprises precipitating the aluminum upon the entire surface of the monocrystals with about a 1% addition of at least another metal selected particularly from gold, silver, iron, nickel and cobalt.

3. The method of claim 2, wherein the layer thickness of the applied metal layer amounts to about $1\mu$.

4. The method of claim 2, wherein an aluminum tape coated with a galvanic layer of the additional metal is used.

References Cited

UNITED STATES PATENTS 3,290,753 12/1966 Chang ______________ 29—25.3

JACOB H. STEINBERG, Primary Examiner

U.S. Cl. X.R.

156—17; 29—25.3, 578; 148—174